(12) United States Patent
Arabi

(10) Patent No.: US 6,557,131 B1
(45) Date of Patent: Apr. 29, 2003

(54) APPARATUS AND METHOD FOR AUTOMATED TESTING OF INTEGRATED ANALOG TO DIGITAL CONVERTERS

(75) Inventor: Karim Arabi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/471,233

(22) Filed: Dec. 23, 1999

(51) Int. Cl.$^7$ ................................................ G01R 31/28
(52) U.S. Cl. ....................................... 714/734; 714/733
(58) Field of Search ............................. 341/120, 122; 330/2; 73/1.01; 375/219; 714/734, 733, 724, 740

(56) References Cited

U.S. PATENT DOCUMENTS

| | | | | |
|---|---|---|---|---|
| 5,068,657 A | * | 11/1991 | Tsai | 341/120 |
| 5,854,598 A | * | 12/1998 | Vries et al. | 341/120 |
| 5,861,774 A | * | 1/1999 | Blumenthal | 330/2 |
| 6,101,864 A | * | 8/2000 | Abrams et al. | 73/1.01 |
| 6,118,811 A | * | 9/2000 | Narumi et al. | 375/219 |
| 6,147,631 A | * | 11/2000 | Maulik et al. | 341/122 |
| 6,211,803 B1 | * | 4/2001 | Sunter | 341/120 |
| 6,232,897 B1 | * | 5/2001 | Knusen | 341/120 |

\* cited by examiner

*Primary Examiner*—David Ton
(74) *Attorney, Agent, or Firm*—Robert P. Bell; Steven A. Lin

(57) ABSTRACT

A Built-In Self-Test (BIST) circuit is employed to automatically test integrated analog to digital converters (ADC). Proposed technique applies delta-sigma ($\Delta\Sigma$) modulator concept to ADC testing and results in a fully automated accurate test procedure suitable for differential non-linearity (DNL) and integral non-linearity (INL) testing. Additional analog circuitry does not have a significant effect on the test accuracy and the test resolution is determined by the sampling frequency of the delta-sigma modulator.

28 Claims, 5 Drawing Sheets

APPARATUS AND METHOD FOR AUTOMATED TESTING OF INTEGRATED ANALOG TO DIGITAL CONVERTERS

FIELD OF THE INVENTION

This invention relates to a built-in self-test (BIST) circuit. More specifically, the present invention relates to a BIST technique and circuitry for analog to digital converters (ADCs).

BACKGROUND OF THE INVENTION

Testing mixed signal integrated circuits is known to be a difficult and time-consuming task. The problem is aggravated by the recent trend of integrating mixed-signal cores into a large digital environment to achieve system-on-a-chip integration. Mixing such circuits leads to ad-hoc and non-standard production test strategies which may require complex and expensive mixed-signal automatic test equipment (ATE).

Recent efforts address the question of mixed-signal test bus standardization which has led to the IEEE.1149.4 standard proposal. The IEEE.1149.4 standard may alleviate controllability and observability problems but cannot solve the problems related to test time and ATE requirements for testing modern high-speed and high-resolution mixed-signal circuits. A mixed-signal BIST approach may reduce test time and cost and allow testing of a mixed-signal ASIC on a digital ATE eliminating the need for expensive mixed-signal ATE.

Many methods for the on-chip testing of ADCs have been presented in the literature. The majority of existing techniques employ an on-chip DAC to apply analog stimuli to the ADC under test. Three problems have to be considered for these techniques. First, they may be limited to applications where one may find an ADC-DAC pair on the same chip. Second, the DAC used to test the ADC should have at least 2-bits of resolution more than the ADC under test. The third problem is fault masking in which a fault in DAC may compensate another fault in ADC. Thus, a need still exists to be able to test embedded ADC individually without using another data converter.

Other techniques which rely on the availability of a micro-controller or DSP core on-chip to test the ADC under test may not be applicable where such an on-chip resource are not available. Another technique, called the oscillation-test method, may be applied to test an ADC in which some small additional circuits are added in the feedback loop and the whole system is oscillated. Differential non-linearity (DNL) error and conversion speed may then be tested by measuring the oscillation frequency of the circuit under test. Test accuracy may be affected by extra components and the test requires precision frequency measurement which may require a long test-time and high testing costs.

SUMMARY OF THE INVENTION

Accordingly, the present invention provides a method and apparatus for on-chip testing of ADCs. The technique disclosed in the present invention is based on the delta-sigma modulator concept. A modulator loop may be constructed using the ADC under test, a digital comparator, a one-bit digital to analog converter (DAC), and an integrator. The analog input of the modulator input may be chosen to be zero. A digital comparator may then be used to inject the equivalent of an offset voltage into the loop using the digital input, $D_{IN}$. A delta-sigma modulator attempts to cancel out the introduced offset voltage and shifts the ADC's average input voltage to the analog voltage level equivalent to the $D_{IN}$.

The whole system may be seen as a DAC converting the digital input, $D_{IN}$, to its equivalent analog voltage, $V_{OUT}$. If the digital input is switched from a code $C_B$ to a code $C_A$, the analog output changes to $V_A$ from $V_B$ which are transition voltages associated with code $C_A$ and code $C_B$ consequently. The number of clock cycles (Clk) which the analog outputs takes to reach $V_A$ from $V_B$ may determine the distance between these two transition voltages. Therefore, the distance between each two predetermined transition voltages may be measured as a function of the number of clock cycles (CLK). If the two transition voltages are adjacent, differential non-linearity (DNL) may be measured. If the first transition voltage is zero, integral non-linearity (INL) may be measured at the upper transition voltage.

The BIST circuitry may also include a control logic which directs the whole operation. The control logic may be used to load Register A and Register B with proper values and determine which register is selected by the multiplexer. The control logic may also be used to count the number of clock cycles to determine DNL or INL for each predetermined code.

DETAILED DESCRIPTION OF THE INVENTION

The embodiments of the present invention will be described herein with reference to the accompanying drawings. Before describing the present invention, a review of some Prior Art circuitry is in order.

Figure 1:
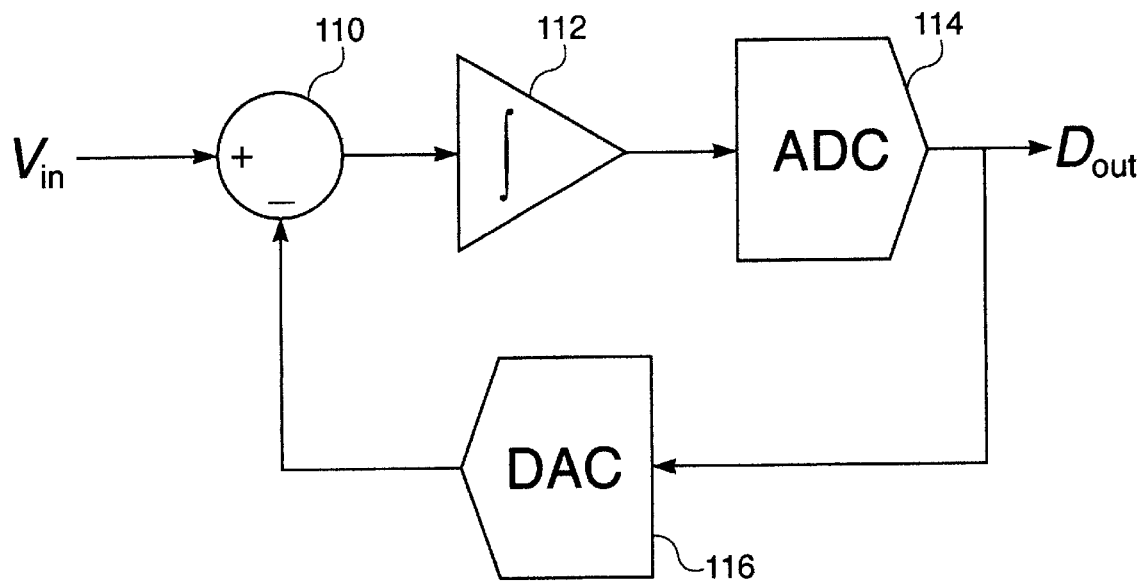
FIG. 1(a) is a schematic block diagram illustrating a prior art, one-bit delta-sigma modulator.
FIG. 1(b) is a schematic diagram of a prior art one-bit delta-sigma modulator including some implementation details of the one-bit ADC and the one-bit DAC.
Figure 1B:
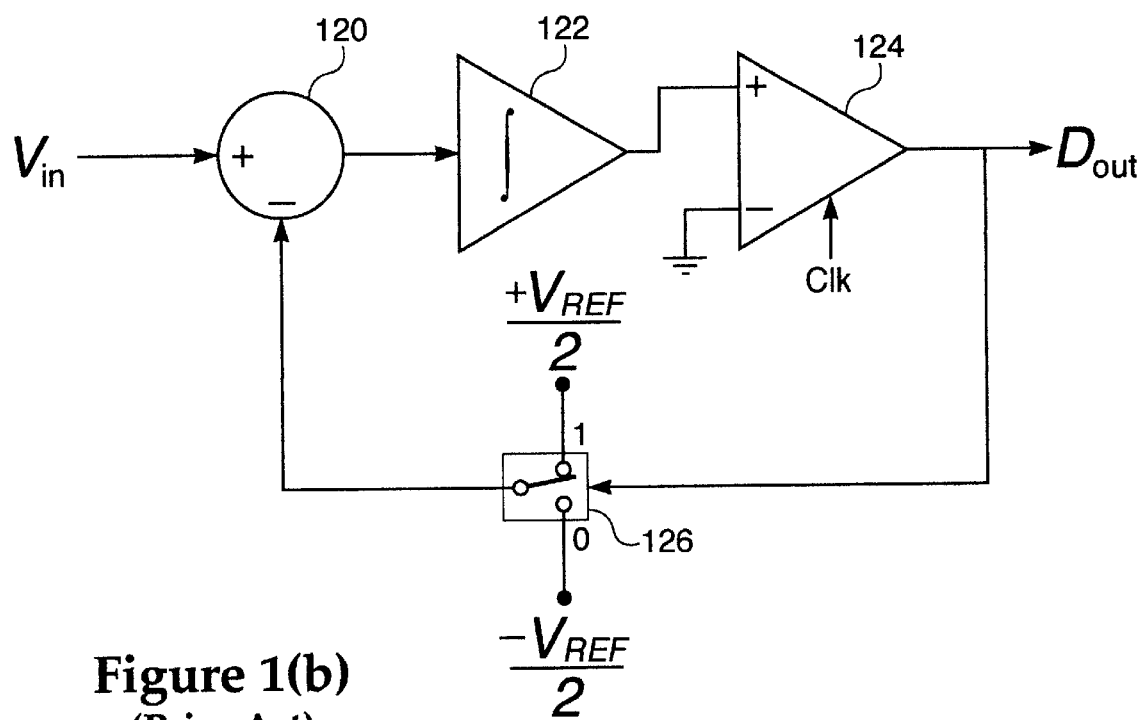

FIG. 1(a) and FIG. 1(b) each illustrate prior art one-bit first-order delta-sigma modulators which have the ability of noise shaping. FIG. 1(a) is a schematic block diagram illustrating a prior art, one-bit delta-sigma modulator. In FIG. 1(a), analog input voltage signal $V_{in}$ is applied to subtractor 110 where a feedback signal may be subtracted. Output of adder 110 is fed to integrating OpAmp 112 whose output in turn is fed to a one-bit Analog to Digital Converter (ADC) 114. The digital output, $D_{out}$, of ADC 114 may then be fed back through Digital to Analog Converter DAC 116 as the feedback signal to subtractor 110.

FIG. 1(b) is a schematic diagram of a prior art one-bit delta-sigma modulator including some implementation details of the one-bit ADC and the one-bit DAC. As in FIG. 1(a), analog input voltage signal $V_{in}$ is applied to subtractor 120 where a feedback signal may be subtracted. Output of adder 120 is fed to integrating OpAmp 122 whose output in turn is fed to a one-bit Analog to Digital Converter (ADC) 124. In this instance, one-bit ADC 124 may comprise another OpAmp having a +terminal coupled to receive the output of integrating OpAmp 122 and the −terminal coupled to ground.

The digital output, $D_{out}$, (which may be 0 or 1) of ADC 124, may then be fed back through Digital to Analog Converter DAC 126 as the feedback signal to subtractor 120. In this instance, DAC 126 may comprise a switch which may be selected by the digital output $D_{out}$ from ADC 124. If $D_{out}$ is 1, for example, the output of DAC 126 may take a voltage level of $+V_{REF}/2$. If $D_{out}$ is 0, for example, the output of DAC 126 may take a voltage level of $-V_{REF}/2$.

The circuits of FIGS. 1(a) and 1(b) have the ability of canceling out any error or non-linearity introduced in the loop by the one-bit ADC to maintain precise digital representation of the analog input, $V_{in}$, at the digital output, $D_{out}$.

Figure 2A:
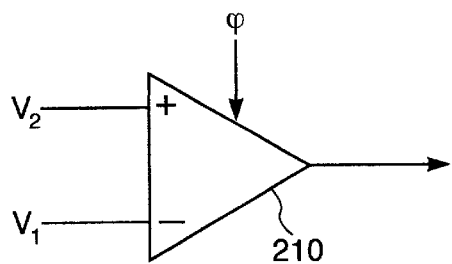
FIG. 2(a) is a schematic block diagram illustrating a prior art, clocked analog comparator.

FIG. 2(a) is a schematic block diagram illustrating a prior art, clocked analog comparator 210. Comparator 210 may receive as its input, two voltages $V_1$ and $V_2$, and, in response to a signal ϕ, output the difference between the two voltages.

Figure 2B:
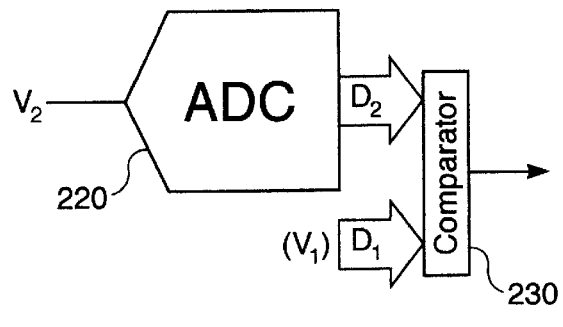
FIG. 2(b) is a schematic block diagram illustrating a mixed-signal implementation of a clocked analog comparator.

FIG. 2(b) is a schematic block diagram illustrating a mixed-signal implementation of a clocked analog comparator. In this embodiment, signal $V_2$ may comprise, for example, an analog voltage signal. Signal $V_1$ may comprise a digital signal $D_1$. Analog voltage signal $V_2$ may pass through analog to digital converter (ADC) 220 and output a digital signal $D_2$. Digital signals $D_1$ and D2 may be compared in digital comparator 230 and the difference output as a digital value.

Figure 3:
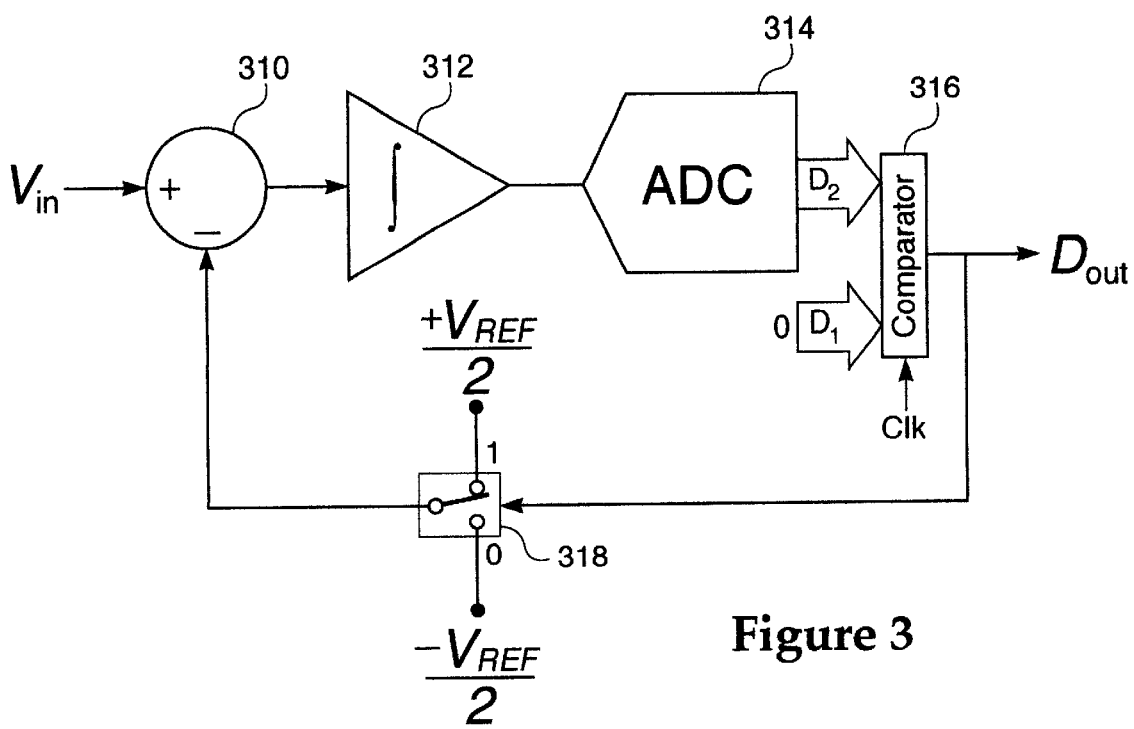
FIG. 3 is a one-bit sigma-delta modulator including the novel mixed-signal comparator.

FIG. 3 is a one-bit sigma-delta modulator including the novel mixed-signal comparator of FIG. 2(b). The apparatus of FIG. 3 describes the preferred embodiment of a first-order delta-sigma modulator of the present invention which includes a novel mixed-signal comparator replacing the conventional comparator. Input voltage $V_{in}$ may be input to subtractor 310, where a feedback voltage may be subtracted. The output of subtractor 310 may be fed to integrating OpAmp 312. The output of integrating OpAmp 312 may in turn be fed to the mixed-signal comparator of FIG. 2(b).

The use of the mixed-signal comparator of FIG. 2(b) allows the threshold voltage of the comparator, $V_1$ (here, illustrated as zero), to be determined using its equivalent digital number, $D_1$. While in the modulator loop, the mixed-signal comparator allows the introduction of an offset voltage in the loop. The offset voltage may be fed to analog to digital converter 314 where it is output as a digital equivalent $D_2$. Digital values $D_1$ and $D_2$ may be compared in comparator 316. The difference value from comparator 316 may be output as digital value $D_{out}$.

Signal $D_{out}$ may be fed back though Analog Converter DAC 318 as the feedback signal to subtractor 310. In this instance, DAC 318 may comprise a switch which may be selected by the digital output $D_{out}$ from comparator 316. If $D_{out}$ is 1, for example, the output of DAC 318 may take a voltage level of $+V_{REF}/2$. If $D_{out}$ is 0, for example, the output of DAC 318 may take a voltage level of $-V_{REF}/2$.

When the input voltage of the modulator, $V_{IN}$, is zero, noise shaping behavior of the modulator suppresses the effect of this introduced offset, $V_1$, by shifting the steady-state comparator's second input voltage to the same voltage level. Therefore, in the steady-state when the input voltage, $V_{in}$, is zero, the modulator forces $V_2=V_1$ and $D_2=D_1$.

Figure 4:
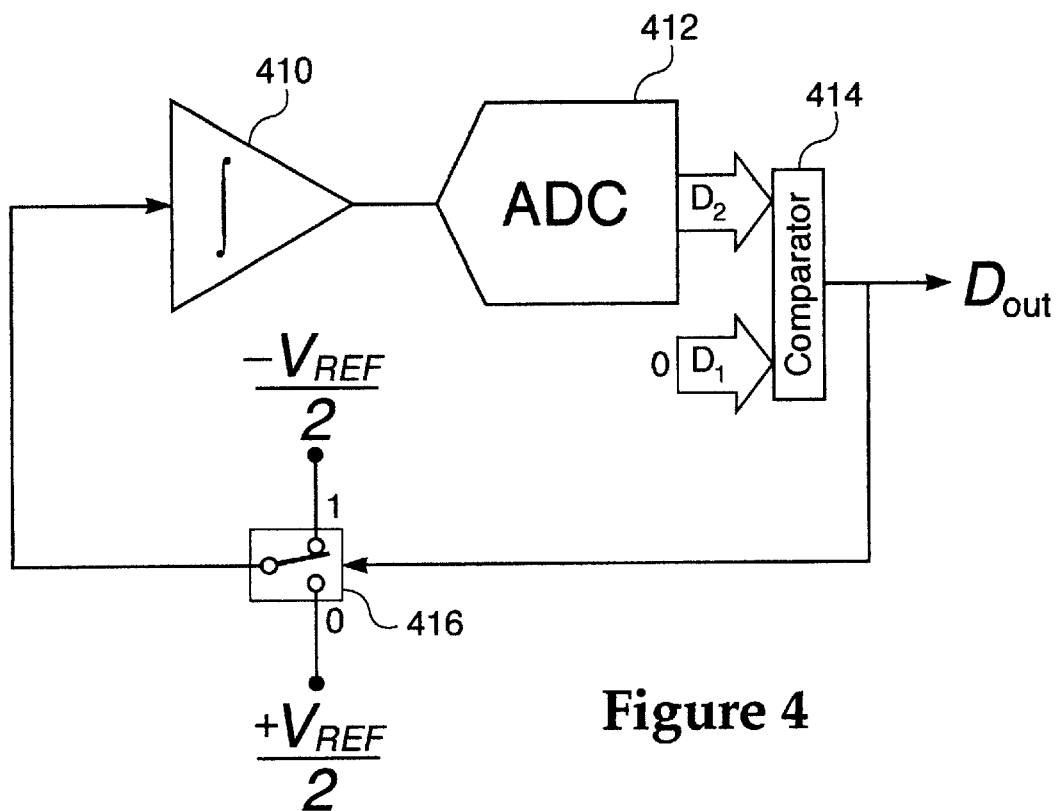
FIG. 4 is a one-bit sigma-delta modulator with its input coupled to the ground.

FIG. 4 illustrates a delta-sigma modulator with its analog input coupled to ground. The polarity of one-bit DAC 416 may be reversed to eliminate the need for a subtractor in the modulator loop.

Figure 5:
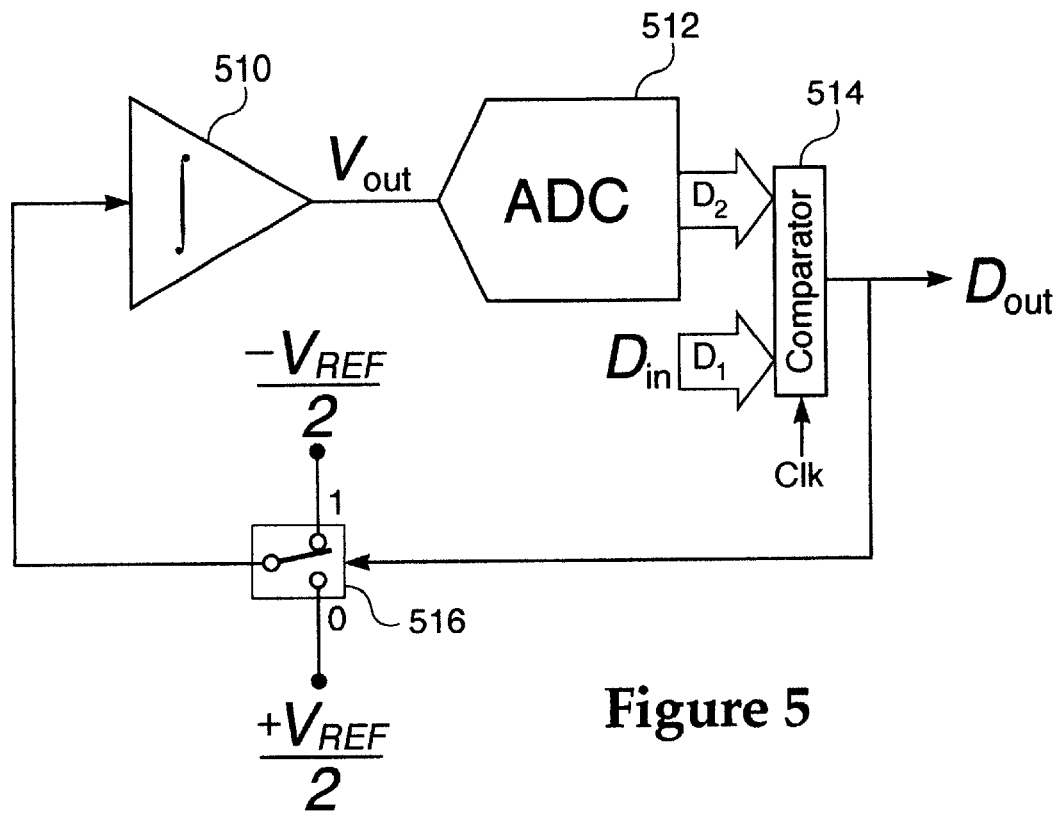
FIG. 5 is a zero-input one-bit sigma-delta modulator with an offset voltage injected in the loop through the $D_{IN}$ input.

For the input-grounded delta-sigma modulator illustrated in FIG. 5, when a non-zero digital number, $D_{in}$, is applied to the $D_1$ input of comparator 514, the modulator loop brings the comparator's second input, $D_2$, to the same level and therefore forcing $D_2=D_1$. Consequently, the analog input of ADC 512, labeled $V_{out}$ here, is forced to be the analog equivalent of $D_{in}$. One may consider the whole system illustrated in FIG. 5, as a DAC converting the digital input, $D_{in}$, to its equivalent analog voltage, $V_{out}$. Note that $V_{out}$ is the ADC's transition voltage associated with the ADC's output code $D_2$ and since the modulator loop forces $D_2=D_{in}$, therefore $V_{out}$ is the transition voltage associated with the input code $D_{in}$. This characteristic of the constructed loop allows one to find the transition voltage of the ADC for each of its predetermined output codes by applying the predetermined code to the input $D_{in}$.

Figure 6:
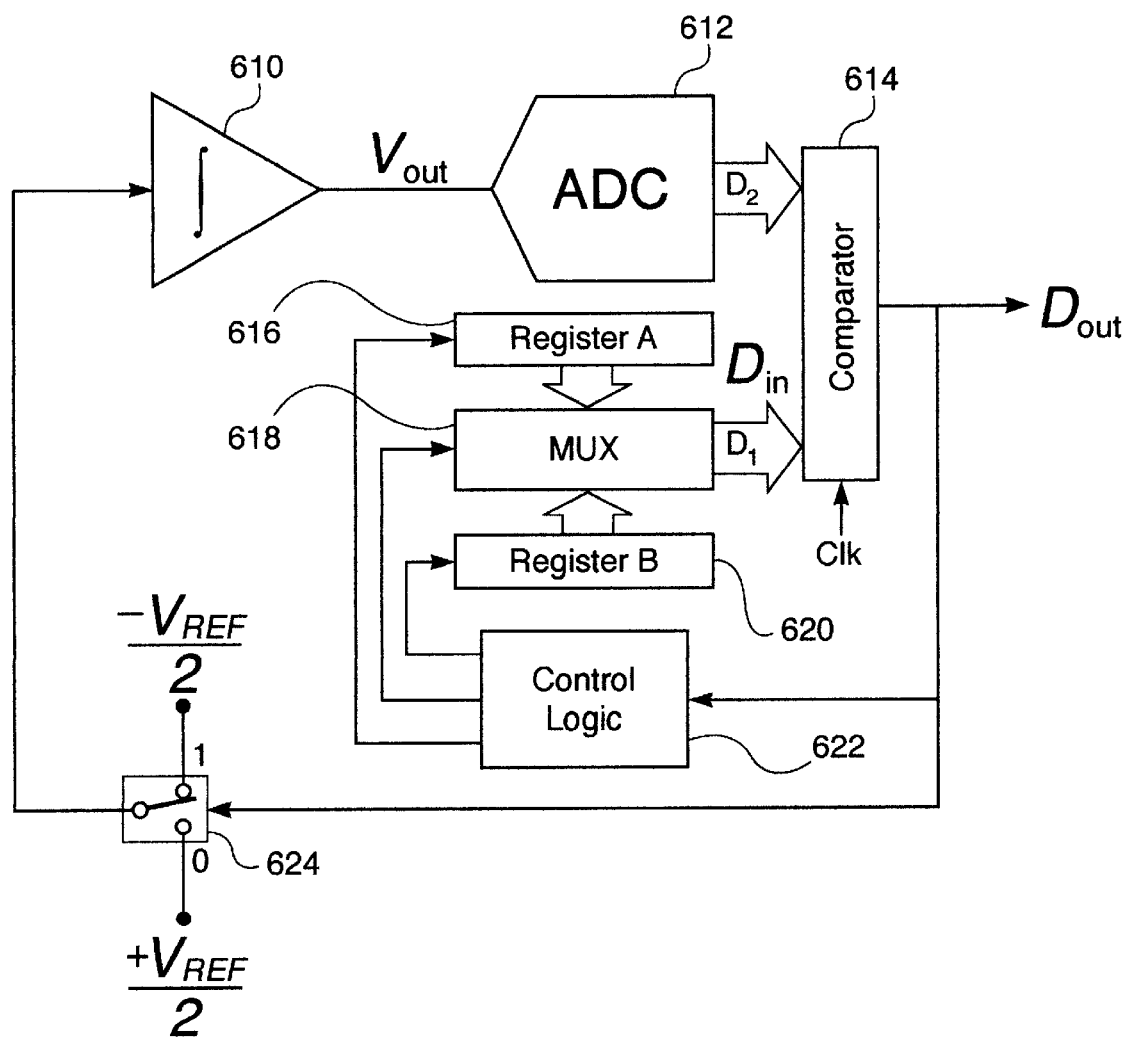
FIG. 6 is a pictorial illustration of the delta-sigma modulator's operation when the $D_{IN}$ is switched to $C_A$ from $C_B$.

As illustrated in FIG. 6, this characteristic may be exploited to test DNL (differential non-linearity) and INL (integral non-linearity) for an ADC under test. The ADC under test will be a part of the comparator in the modulator loop and all other parts of the modulator are considered as the BIST circuitry.

To measure DNL at each predetermined code, $C_k$, the $D_{in}$ should be switched from its adjacent lower code, $C_{k-1}$, to a target code, $C_k$, such that the input to ADC 612 changes from the $V_{Tk-1}$ to $V_{Tk}$ which are transition voltages associated to the $C_{k-1}$ and $C_k$ receptively. The number of clock cycles which the modulator loop requires to reach $V_{Tk}$ from $V_{Tk-1}$ determines the least significant bit (LSB) voltage level and any deviation from the ideal value represents the DNL error in terms of number of clock cycles.

To measure INL at each code predetermined code, $C_k$, the value for $D_{in}$ should be switched from the zero code, 00 . . . 0, to the target code, $C_k$, such that the input of ADC 612 changes from the 0 to $V_{Tk}$. The number of clock cycles which the modulator loop requires to reach $V_{Tk}$ from 0 determines the actual voltage level for the target code and any deviation from the ideal value represents the INL error in terms of number of clock cycles.

In both DNL and INL testing cases, the Register A 616 may be loaded with value $C_k$. Register B 620 may be loaded either with $C_{k-1}$ for DNL testing or with a zero code, 00 . . . 0, for INL testing.

Control logic 622 may direct either testing operation and its specific design depends on the number of tests to be applied during BIST mode. Control logic 622 may load Register A 616 and Register B 620 with proper values, and control the position of the multiplexer, MUX 628 to output an appropriate value for $D_1$ ($D_{in}$) into comparator 614. Control logic 622 may also count the number of clock cycles and decides whether the test result is pass or fail. The nominal value of a number of clock cycles may be determined by the design engineer without undue experimentation.

Figure 7:
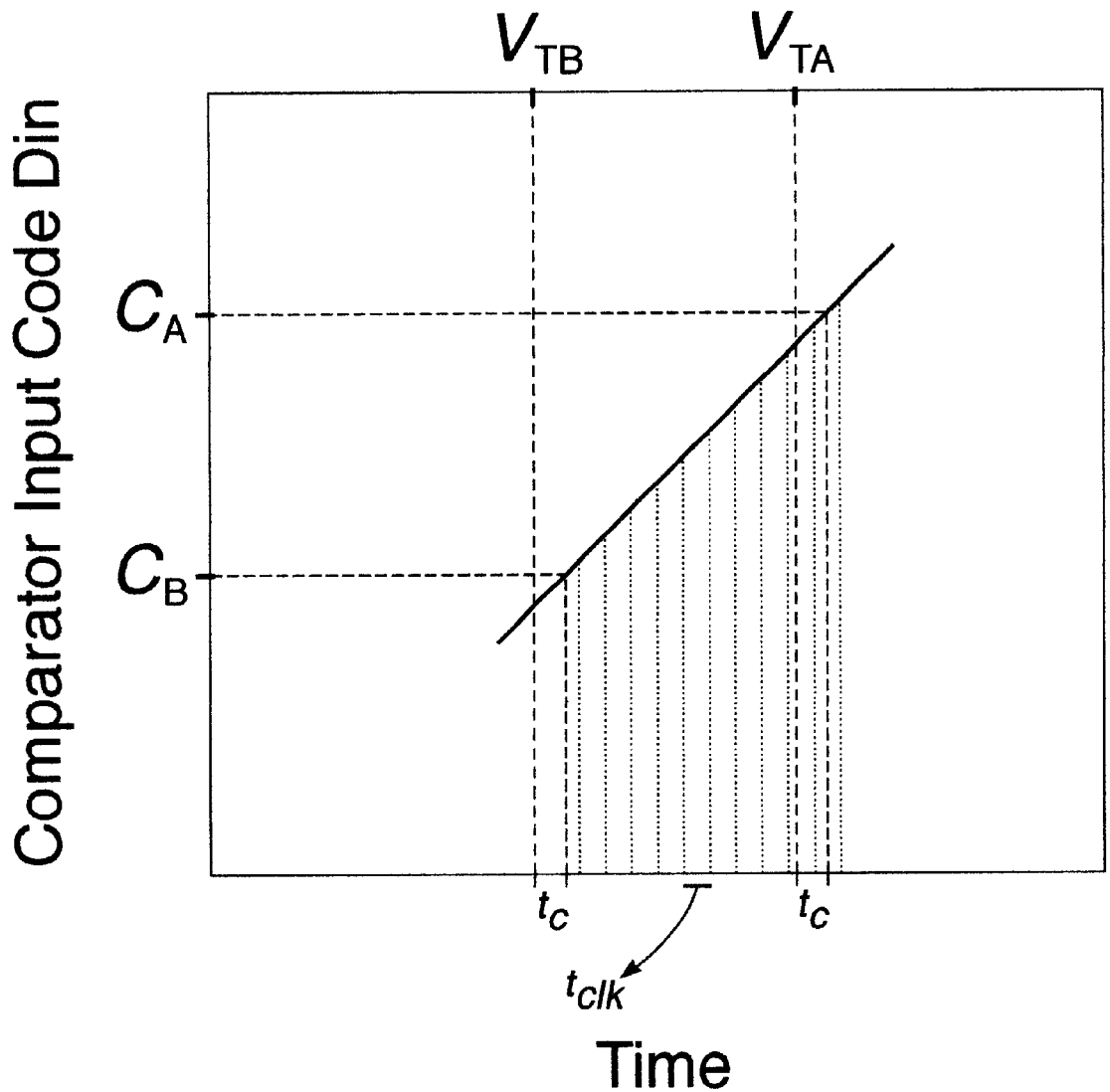
FIG. 7 is a one-bit sigma-delta modulator including the ADC under test and the rest of BIST circuitry.

FIG. 7 depicts the graphical illustration of the BIST circuitry operation and ADC 612 under test, when the input code to the comparator 614 is switched from $C_B$ to $C_A$. As a result the input of ADC 612 changes from the transition $V_{TB}$ to the transition voltage $V_{TA}$. As illustrated in FIG. 7, in this particular example, it takes about 10 clock cycles ($t_{Clk}$) for the input of ADC 612 to reach $V_{TA}$ from $V_{TB}$. The effect of ADC conversion time, $t_C$, is also illustrated in FIG. 7. The same procedure may be repeated and the results may be averaged to achieve better accuracy.

While the preferred embodiment and various alternative embodiments of the invention have been disclosed and described in detail herein, it may be apparent to those skilled in the art that various changes in form and detail may be made therein without departing from the spirit and scope thereof.

I claim:

1. A semiconductor device comprising:

an analog to digital converter (ADC) circuit having an analog input and a digital output; and a Built-in Self-test (BIST) circuit, coupled to the analog to digital converter (ADC) circuit, for testing the analog to digital converter, the BIST circuit including:

a digital comparator having at least two input terminals and a digital output, at least one of the input terminals being coupled to the digital output of the ADC when under test, and at least another input terminals coupled to receive a digital input signal, a one-bit digital to analog converter (DAC) having a digital input coupled to the output of the digital comparator, and an analog output; and an analog integrator having an input coupled to the output of the one-bit DAC and an output coupled to the analog input of the ADC when under test, wherein the BIST circuit, along with the ADC, when under test, forming a delta-sigma modulator where the analog input of the ADC is coupled to ground.

2. A semiconductor device comprising:

an analog to digital converter (ADC) circuit having an analog input and a digital output;

a Built-in Self-test (BIST) circuit, coupled to the analog to digital converter (ADC) circuit, for testing the analog to digital converter;

a one-bit digital to analog converter (DAC) having a digital input and an analog output;

an analog integrator having an output coupled to the analog input of the ADC when under test, the analog integrator further having an input coupled to the analog output of the one-bit DAC;

a digital multiplexer having a plurality of input terminals, a one-bit select input, and an output bus, such that depending on the select input value, one of the plurality of inputs is coupled to the output bus; and a digital comparator having a plurality of input terminals and a digital output, at least one of the plurality of input terminals being coupled to the digital output of the ADC when under test, and at least one of the plurality of inputs coupled to the output bus of the digital multiplexer, wherein the BIST circuit, along with the ADC, when under test, forming a delta-sigma modulator where the analog input of the ADC is coupled to ground.

3. The semiconductor device of claim 2, wherein said one-bit digital to analog converter comprises a switch and two voltage references ($-V_{REF}/2$ and $+V_{REF}/2$) and having an analog output coupled to the input of the analog integrator and a digital input coupled to the digital output of the digital comparator.

4. The semiconductor device of claim 3, further comprising:

a first register having an input and an output; and a second register having an input and an output;

wherein the output of the first register and the output of the second register are coupled to the digital multiplexer, and wherein the input of the first register and the input of the second register are coupled to a control logic.

5. The semiconductor device of claim 4, wherein one of the plurality of input terminals of the digital multiplexer is coupled to an output of the first register, and one of the plurality of input terminals is coupled to an output of the second register, wherein the select input of the digital multiplexer is coupled to a control logic, and wherein the digital output of the digital multiplexer is coupled to one of the plurality of input terminals of the digital comparator.

6. The semiconductor device of claim 5, wherein the control logic is coupled to the first register, the second register, the digital multiplexer, and the output of the digital comparator, the control logic comprising a finite-state machine for directing the BIST test procedure.

7. A method of operating a built-in self-test circuit for testing differential non-linearity error (DNL) of an analog-to-digital converter (ADC), the method comprising the steps to measure DNL at code $C_k$:

loading a first register with a code $C_k$;

loading a second register with a code $C_{k-1}$;

switching an input of a digital comparator from $C_{k-1}$ to $C_k$ using a digital multiplexer;

measuring a number of clock cycles for a modulator to change from $V_{Tk-1}$ to $V_{Tk}$ (transition voltages associated to $C_{k-1}$ and $C_k$); and comparing the number of the clock cycles to an ideal number to determine a pass or fail result.

8. A method of operating the built-in self-test circuit for testing integral non-linearity of an analog to digital converter (ADC), the method comprising the steps of:

loading a first register with a code $C_k$;

loading a second register with a code "00 . . . 0";

switching the input of a digital comparator from "00 . . . 0" to $C_k$ using the digital multiplexer;

measuring a number of clock cycles for a modulator to change from zero to $V_{Tk}$ (transition voltage associated to $C_k$); and comparing the number of the clock cycles to an ideal number to determine the pass or fail result.

9. A method of testing a semiconductor device comprising an analog to digital converter (ADC) circuit having an analog input and a digital output and a Built-in Self-test (BIST) circuit, coupled to the analog to digital converter (ADC) circuit, for testing the analog to digital converter, the method comprising the steps of:

forming, under test, a delta-sigma modulator from the BIST circuit and the ADC, comparing the output of the ADC with a digital signal input to produce a digital signal output, converting, in a one-bit digital to analog converter (DAC) the digital signal output to produce an analog output, and integrating, in an analog integrator, the analog output from the one-bit DAC to produce an output coupled to the analog input of the ADC when under test, and coupling the analog input of the ADC to ground.

10. A method of testing a semiconductor device comprising an analog to digital converter (ADC) circuit having an analog input and a digital output and a Built-in Self-test (BIST) circuit, coupled to the analog to digital converter (ADC) circuit, for testing the analog to digital converter, the method comprising the steps of:

forming, under test, a delta-sigma modulator from the BIST circuit and the ADC, and coupling the analog input of the ADC to ground;

wherein the semiconductor device further comprises a one-bit digital to analog converter (DAC) having a digital input and an analog output, and an analog integrator having an output coupled to the analog input of the ADC when under test, the analog integrator further having an input coupled to the analog output of the one-bit DAC, and wherein the semiconductor device further comprises a digital multiplexer having a plurality of input terminals, a one-bit select input, and an output bus, such that depending on the select input value, one of the plurality of inputs is coupled to the output bus, and a digital comparator having a plurality of input terminals and a digital output, at least one of the plurality of input terminals being coupled to the digital output of the ADC when under test, and at least one of the plurality of inputs coupled to the output bus of the digital multiplexer.

11. The method of claim 10, wherein the one-bit digital to analog converter comprises a switch and two voltage references ($-V_{REF}/2$ and $+V_{REF}/2$) and having an analog output coupled to the input of the analog integrator and a digital input coupled to the digital output of the digital comparator.

12. The method of claim 11, wherein the semiconductor device further comprises a first register having an input and an output, and a second register having an input and an output, said method comprising the steps of:

coupling the output of the first register and the output of the second register to the digital multiplexer, and coupling the input of the first register and the input of the second register are coupled to a control logic.

13. The method of claim 12, further comprising the steps of:

coupling one of the plurality of input terminals of the digital multiplexer to an output of the first register, coupling one of the plurality of input terminals to an output of the second register, coupling the select input of the digital multiplexer to a control logic, and coupling the digital output of the digital multiplexer to one of the plurality of input terminals of the digital comparator.

14. The method of claim 13, further comprising the steps of:

coupling the control logic to the first register, the second register, the digital multiplexer, and the output of the digital comparator, the control logic comprising a finite-state machine for directing the BIST test procedure.

15. A built-in self-test circuit for testing differential non-linearity error (DNL) of an analog-to-digital converter (ADC), by measuring DNL at code $C_k$, comprising:

a first register for loading with a code $C_k$;

a second register for loading with a code $C_{k-1}$;

a digital multiplexer for switching an input of a digital comparator from $C_{k-1}$ to $C_k$;

means for measuring a number of clock cycles for a modulator to change from $V_{Tk-1}$ to $V_{Tk}$ (transition voltages associated to $C_{k-1}$ and $C_k$); and means for comparing the number of the clock cycles to an ideal number to determine a pass or fail result.

16. A built-in self-test circuit for testing integral non-linearity of an analog to digital converter (ADC), comprising:

a first register for loading with a code $C_k$;

a second register for loading with a code "00 . . . 0";

a digital multiplexer for switching the input of a digital comparator from "00 . . . 0" to $C_k$;

means measuring a number of clock cycles for a modulator to change from zero to $V_{Tk}$ (transition voltage associated to $C_k$); and means for comparing the number of the clock cycles to an ideal number to determine the pass or fail result.

17. A semiconductor device comprising:

an analog to digital converter (ADC) circuit having an analog input and a digital output;

a Built-in Self-test (BIST) circuit, coupled to the analog to digital converter (ADC) circuit, for testing the analog to digital converter;

a digital multiplexer having a plurality of input terminals, a one-bit select input, and an output bus, such that depending on the select input value, one of the plurality of inputs is coupled to the output bus; and a digital comparator having a plurality of input terminals and a digital output, at least one of the plurality of input terminals being coupled to the digital output of the ADC when under test, and at least one of the plurality of inputs coupled to the output bus of the digital multiplexer, wherein the BIST circuit, along with the ADC, when under test, forming a delta-sigma modulator where the analog input of the ADC is coupled to ground.

18. The semiconductor device of claim 17, wherein said one-bit digital to analog converter comprises a switch and two voltage references ($-V_{REF}/2$ and $+V_{REF}/2$) and having an analog output coupled to the input of the analog integrator and a digital input coupled to the digital output of the digital comparator.

19. The semiconductor device of claim 18, further comprising:

a first register having an input and an output; and a second register having an input and an output;

wherein the output of the first register and the output of the second register are coupled to the digital multiplexer, and wherein the input of the first register and the input of the second register are coupled to a control logic.

20. The semiconductor device of claim 19, wherein one of the plurality of input terminals of the digital multiplexer is coupled to an output of the first register, and one of the plurality of input terminals is coupled to an output of the second register, wherein the select input of the digital multiplexer is coupled to a control logic, and wherein the digital output of the digital multiplexer is coupled to one of the plurality of input terminals of the digital comparator.

21. The semiconductor device of claim 20, wherein the control logic is coupled to the first register, the second register, the digital multiplexer, and the output of the digital comparator, the control logic comprising a finite-state machine for directing the BIST test procedure.

22. A method of testing a semiconductor device comprising an analog to digital converter (ADC) circuit having an analog input and a digital output and a Built-in Self-test (BIST) circuit, coupled to the analog to digital converter (ADC) circuit, for testing the analog to digital converter, the method comprising the steps of:

forming, under test, a delta-sigma modulator from the BIST circuit and the ADC, and coupling the analog input of the ADC to ground, wherein the semiconductor device further comprises a digital multiplexer having a plurality of input terminals, a one-bit select input, and an output bus, such that depending on the select input value, one of the plurality of inputs is coupled to the output bus, and a digital comparator having a plurality of input terminals and a digital output, at least one of the plurality of input terminals being coupled to the digital output of the ADC when under test, and at least one of the plurality of inputs coupled to the output bus of the digital multiplexer.

23. The method of claim 22, wherein the one-bit digital to analog converter comprises a switch and two voltage references ($-V_{REF}/2$ and $+V_{REF}/2$) and having an analog output coupled to the input of the analog integrator and a digital input coupled to the digital output of the digital comparator.

24. The method of claim 23, wherein the semiconductor device further comprises a first register having an input and an output, and a second register having an input and an output, said method comprising the steps of:

coupling the output of the first register and the output of the second register to the digital multiplexer, and coupling the input of the first register and the input of the second register are coupled to a control logic.

25. The method of claim 24, further comprising the steps of:

coupling one of the plurality of input terminals of the digital multiplexer to an output of the first register, coupling one of the plurality of input terminals to an output of the second register, coupling the select input of the digital multiplexer to a control logic, and coupling the digital output of the digital multiplexer to one of the plurality of input terminals of the digital comparator.

26. The method of claim 25, further comprising the steps of:

coupling the control logic to the first register, the second register, the digital multiplexer, and the output of the digital comparator, the control logic comprising a finite-state machine for directing the BIST test procedure.

27. A semiconductor device comprising:

an analog to digital converter (ADC) circuit having an analog input and a digital output;

a Built-in Self-test (BIST) circuit, coupled to the analog to digital converter (ADC) circuit, for testing the analog to digital converter;

a one-bit digital to analog converter (DAC) having a digital input and an analog output; and an analog integrator having an output coupled to the analog input of the ADC when under test, the analog integrator further having an input coupled to the analog output of the one-bit DAC, wherein the BIST circuit, along with the ADC, when under test, forming a delta-sigma modulator where the analog input of the ADC is coupled to ground, and wherein said one-bit digital to analog converter comprises a switch and two voltage references ($-V_{REF}/2$ and $+V_{REF}/2$) and having an analog output coupled to the input of the analog integrator and a digital input coupled to the digital output of the digital comparator.

28. A method of testing a semiconductor device comprising an analog to digital converter (ADC) circuit having an analog input and a digital output and a Built-in Self-test (BIST) circuit, coupled to the analog to digital converter (ADC) circuit, for testing the analog to digital converter, the method comprising the steps of:

forming, under test, a delta-sigma modulator from the BIST circuit and the ADC, and coupling the analog input of the ADC to ground, wherein the semiconductor device further comprises a one-bit digital to analog converter (DAC) having a digital input and an analog output, and an analog integrator having an output coupled to the analog input of the ADC when under test, the analog integrator further having an input coupled to the analog output of the one-bit DAC, and wherein the one-bit digital to analog converter comprises a switch and two voltage references ($-V_{REF}/2$ and $+V_{REF}/2$) and having an analog output coupled to the input of the analog integrator and a digital input coupled to the digital output of the digital comparator.

* * * * *